United States Patent [19]

Gimzewski et al.

[11] Patent Number: 5,547,774

[45] Date of Patent: Aug. 20, 1996

[54] MOLECULAR RECORDING/REPRODUCING METHOD AND RECORDING MEDIUM

[75] Inventors: James Gimzewski, Zuerich; Michele Parrinello, Horgen; Bruno Reihl, Wilen, all of Switzerland

[73] Assignee: International Business Machines Corporation, Armonk, N.Y.

[21] Appl. No.: 114,895

[22] Filed: Sep. 1, 1993

[30] Foreign Application Priority Data

Oct. 8, 1992 [EP] European Pat. Off. .............. 92810762

[51] Int. Cl.⁶ ...................................................... G11B 5/66
[52] U.S. Cl. .................................. 428/694 ML; 428/64.2; 428/694 SC; 428/694 T; 365/117; 365/118; 365/151; 430/945
[58] Field of Search .......................... 428/694 ML, 64.2, 428/694 SC, 900, 694 T; 430/945; 365/117, 118, 151

[56] References Cited

FOREIGN PATENT DOCUMENTS 2187943  7/1990  Japan .
3250440  11/1991  Japan .

OTHER PUBLICATIONS

P. P. Schmidt et al., "Endohedral Vibrations Of Na/sup +/ in C/sub 60/" Journal of Physical Chemistry, Dec. 26, 1991, vol. 95, No. 26, pp. 10537–10541.
S. K. Estreicher et al. "Stable and metastable states of C/sub 60/H: buckminsterfullerene monohydride", Chemical Physics Letters, vol. 196 No. 3–4, Aug. 14, 1992, NL pp. 311–316.
A. Aviram et al. "Information Storage With Scanning Tunneling Microscope" IBM Technical Disclosure Bulletin, vol. 32, No. 2, Jul. 1989, pp. 285–286.
Y. Chai et al. "Fullerenes with Metals Inside", Journal of Physical Chemistry, vol. 95, 1991, pp. 7564–7568.

*Primary Examiner*—Leszek Kiliman
*Attorney, Agent, or Firm*—David Aker

[57] ABSTRACT

A recording and reproducing method for binary coded information and a suitable recording medium are described, which use endohedrally doped cagelike molecules 30, especially fullerenes and derivatives thereof, as storage elements. By applying a probing tip 36 to the molecule for the read/write process an enhanced storage density is achieved.

22 Claims, 4 Drawing Sheets

MOLECULAR RECORDING/REPRODUCING METHOD AND RECORDING MEDIUM

The present invention relates to a method for recording and reproducing binary coded information. These methods are also known as binary or digital storage. Binary coded information comprises different types of information, including video and audio information, translated into series of only two bits ('0' and '1'). Further it relates to a recording or storage medium with storage elements retaining information distinguishable from adjacent storage elements. Each storage element can retain a single bit of the coded information.

BACKGROUND OF THE INVENTION

Known recording methods are based on magnetic or optical read/write (R/W) techniques or a mixture of both. Well-known devices are, for example, the magnetic disk storage, even better known as hard disk, and the magneto-optical disk storage, which recently gained access to the computer market. Another example of an optical device for mass data storage is the so-called compact disk (CD), which belongs to the read only memories (ROMs).

A typical hard disk consists of several disk-shaped substrates covered with one or several layers of magnetic material, e.g. iron oxide, chromium dioxide, or Fe-, Co-, and Ni-alloys. The information is stored and read by a magnetic head which floats within a small distance over the disk. In the case of the conventional magnetic disk systems, the size of the magnetic head and the length of the transition zone, i.e. the distance over which the recording material changes its direction of magnetization, roughly govern the area of a storage element. Such a storage element, in case of magnetic recording devices also known as bit domain, is defined as the area in which the smallest information unit (bit) is stored.

In magneto-optical storage devices, as described, for example, in EP-A-0498459, the change of magnetization is supported by laser radiation. In this case, the size of the storage element is defined by the size of the focal spot on the recording material and, thus, restricted by the wavelength of the laser radiation.

Even higher storage densities, i.e. a larger number or storage elements per unit area, can be achieved by a technique known as spectral hole burning. This technique is described, for example, in U.S. Pat. No. 4,101,976. It uses light-absorbing molecules for data storage. These molecules are imbedded in a matrix which mainly shifts the absorption bands of the molecules. With a large number ($10^9$) of molecules per storage element involved, the combined absorption bands spread over a relatively large range of wave numbers. It is possible to store information using a laser, the radiation of which has only a small band width compared to the combined absorption bands of the molecules. The ratio of absorption bandwidth over laser radiation band width limits the number of storage elements per laser spot size. Even though it is possible to establish this ratio around $10^3$, still approximately $10^6$ light-absorbing molecules are serving as one storage element.

Another technique, also working on a molecular level, is described in U.S. Pat. No. 4,032,901. It makes use of natural or artificially synthesised macromolecules, having a size around 10 nm or less, which are deposited as a layer. Small regions of this layer, with lateral dimensions of 100 nm or less, can be selectively modified by a narrowly focussed electron beam without affecting adjacent regions, to store (write) information as a pattern of regions of modified particles. Each region is regarded as a storage elements. After depositing a thin metallic film onto the layer, the stored information is read out by a detecting electron beam. Even those storage devices and techniques which make use of recording material on a molecular scale, still show restrictions concerning the size of the storage element's area. This area is limited by the focal spot of either the laser beam or the electron beam.

Modern electronic equipment, such as computers, microprocessors, laser printers, and even the quickly growing field of digitally processed media, e.g. music and image processing, require large storage capacities for binary coded data. It is, therefore, an object of the invention to provide a new method for storing binary coded data. It is a further object of the invention to provide a method for a recording and reproducing method for media with a high storage density. More specifically, it is an object of the invention to provide a method for using storage elements of molecular size. Another object is to provide a recording or storage medium with a high storage density. A further object of the invention is to provide a recording medium having storage elements of a size which is reducible to the size of the molecules used as recording material.

DESCRIPTION OF THE INVENTION

The new recording and reproducing method, as well as the new recording medium is characterized by the use of cage-like molecules, preferably molecules known as fullerenes, or derivatives thereof, as storage elements.

Fullerenes are composed of carbon atoms, forming a shell. The number of carbon atoms within one molecule varies from 60 to well over 300. The currently best known fullerene is the so-called 'buckyball' or 'footballen', which possesses the $C_{60}$ structure (Chemical Abstract No. 99685-96-8). While the shape of the buckyball molecule is close to an ideal sphere, fullerenes with a higher number of carbons are distorted, and, hence, show a lower symmetry than $C_{60}$. For these molecules, the depictive name 'nanotube' has been coined. As it is easier to induce different states, separated by potential barriers, within fullerenes of a higher number of carbon atoms, these are preferably used. Especially suitable for the purpose of this invention are fullerenes in the range between $C_{70}$ and $C_{120}$. Derivatives of fullerenes are characterized by having elements others than carbon in the shell, or atoms or molecular groups attached to it. Some of these are described below.

Various methods to produce fullerenes are known to a person skilled in the art. Most of them are based on the use of a carbon arc in a vacuum chamber filled with an inert gas (He, Ne, Ar, Kr, Xe) at low pressure, as first described by Krätschmer et al., *Nature* 347(1990), 354–358. In another method, a vaporizing laser beam is directed onto a carbon target, applying a pulsed stream of helium as carrier gas for the vaporized carbon. As it is known that fullerenes result from nearly every incomplete (i.e. oxygen-deficient), sooting combustion of carbon with higher or lesser efficiency, further methods to produce fullerenes are readily perceivable by a person skilled in the art.

Different fractions of fullerenes can be separated by either chemical or physical methods or by applying a mixture of both. These methods include standard extraction procedures, using benzene, tetramethylbenzene, trichlorobenzene, xylene, toluene, supercritical $CO_2$, carbon disulfide, hexane, THF, etc. as solvents, as well as vacuum heating procedures or chromatographic methods, such as high performance liquid chromatography. Examples for the preparation of fullerenes are described by R. D. Johnson et al., *J. Am. Chem. Soc.* 113(1991), 3619, or F. Diederich, *Science* 252(1991), 548.

In order to serve as storage elements, the fullerenes must be switchable between at least two distinct states. This is preferably accomplished by endohedrally doping the fullerenes. Endohedrally doping is defined as placing the dopant in the interior of the fullerene's cage. To distinguish between usual molecular compounds and endohedrally doped molecules, a new nomenclature is used in this description. For example, a fullerene with shell consisting of 82 carbon atoms and with one lanthanum in the interior of the shell is shortly referred to as $La@C_{82}$. Suitable dopants are characterized by inducing a distortion (e.g. change of occupation, shifts in energy) of the electronic states of fullerene in comparison with the undoped species. Preferred dopants are elements, like Group I metals, having a high electronegativity or electropositivity compared to carbon, ions or molecules with a large dipole moment. e.g. $H_2O$, which may be permanent or inducible. Other preferred dopants are Group IIIa,b elements, those belonging to the transition metals, including Cu and Zn, and rare earth elements. The distortion induced by these dopants is used to sense the current state of the fullerene.

Several methods to produce endohedrally doped fullerenes are applicable within the scope of the invention. For example, they can be extracted from soot produced by arcburning of either composite carbon/dopant rods or carbon rods with a dopant containing core, as described by Y. Chai et al., *J. Phys. Chem.* 95(1991), 7564–7568, or R. D. Johnson et al., *Nature* 355(1992), 239.

Other cagelike molecules, also possessing the capability to store atoms and molecules, are known as zeolites.

According to the invention the cagelike molecules are fixed to a substrate. Thus, unwanted migration of the molecules on the surface is prevented. The substrate, itself, may form the covering layer of a rigid data recording disk, as used by the conventional data storage systems, already described above. Substrates can be chosen from a wide range of different materials, depending on the requirements of the producer. Suitable materials for the substrate include Au or Si. It is preferred to fix the cagelike molecules to the substrate by attaching one or more functional groups to the molecule, which, in turn, bond to the substrate. Functional groups in organic chemistry, generally, enlarge the reactivity of a molecule by inducing an locally unbalanced charge distribution within the molecule or the ligands. They provide the possibility to perform well known reaction types, as are described in every standard text book of organic chemistry (e.g. J. March, Advanced Organic Chemistry, 3rd ed.). Typical functional groups are halogenes (—Cl, —Br, —F, —I), hydroxide (—OH), carbonyl (=O), carboxyl (—COOH), as well as sulfur-, silicon-, or nitrogen- (—CN) containing groups.

The attachment of a functional group can be attained by substituting a hetero-atom in the carbon shell of the fullerene. This approach is known, for example, from Guo Ting et al., *J. Phys. Chem.* 95(1991), 4948. One or more hetero-atoms in the shell of the fullerene not only facilitate the bonding to a substrate, but also can advantageously induce a potential with two or more stable sites, separated by potential barriers in the interior of the cage. Another way of attaching the functional group to the carbon atoms of the shell is to perform an addition reaction by breaking its system of conjugate bonds. Examples of this method are described by H. W. Kroto et al., *Nature* 357(1992), 479–481. by J. S. Miller, *Adv. Mater.* 3(1991), No.5, 262–264, and by J. M. Hawkins. *Science* 252(1991), 312–313. By this technique, a variety of functional groups can be added to the fullerenes.

These functional groups can bond either directly or indirectly, i.e. via another (intermediate) functional group, to the surface of the substrate. In surface science, especially in the field of self-assembling molecular layers, many suitable pairs of surface-bonding groups are known. Examples for such pairs are thiocarbonyles-Au, thionitrosyles-Au, or silicon trichloride-Si. However, the invention is not restricted to the presented examples, as it is possible for any person skilled in the art to choose from the known manifold surface materials and bonding groups serving his purposes best.

With the endohedrally doped fullerene bonded to the surface, means to perform a read/write (R/W) process are used to store, retain and read the digital coded information. Though it is perceivable to use means known in field of storage devices, such as laser beams, to provide the energy for switching the fullerenes between their different states, these alone do not fully exploit the reduced size of the single storage elements, as described above. Therefore, R/W techniques are preferred which are operable in molecular dimensions. Most preferred are scanning probe techniques based on the positioning of a tip in the proximity of a storage element, i.e. the cagelike molecule. Examples for the scanning probe techniques are the well known scanning tunneling microscope (STM) as well as the related atomic force microscope (AFM), surface potentiometry, or scanning thermal profilometry. These techniques are described, for example, extensively in: R. J. Behm, N. Garcia and H. Rohrer (Eds.), Scanning Tunneling Microscopy and Related Methods, NATO ASI series E: Applied Sciences Vol. 184 (1990). Within the description, these techniques are commonly referred to as SPM (scanning probe microscopy). They are also known as SXM with X being a variable for the specific method used. These instruments are characterized by using piezoelectric elements for positioning the tip, and, thus, allowing manipulations on a surface with an accuracy of less than one nanometer. Storing is done by moving the tip of the microscope in the proximity of a fullerene and applying an external perturbation, usually an electric field, to switch this molecule from one state to another. e.g. moving the caged dopant between its 'up' and 'down' positions. These states are defined as binary '1' and '0', respectively. As the different positions are separated by a potential barrier, the molecule retains its current state until the next writing cycle occurs. The change from one state to the other can be facilitated by diminishing the potential barrier between different position of the dopant. This is preferably done by applying an external electric field across the molecules or by using thermal or electron excitation, provided, for example, by laser radiation. It is also possible to stabilize the position of the dopant by applying, for example, a DC electric field across the molecules. As already described above, stabilizing or destabilizing of the position of the dopant is also achieved by chemical methods, e.g. by introducing hereto atoms or adding functional groups to the fullerene.

For the read process, any technique sensitive to the change within the molecule is feasible: Optical or rather spectroscopic methods can be applied, if the electronic transitions are determined by the position of the dopant. Nuclear magnetic resonance is suitable, if the position of the dopant shifts the resonance frequency of some of the carbon atoms of the shell. However, it is advantageous to use the same technique for the complete R/W process. Therefore, it is preferred to use a scanning probe technique also for reading the stored data. SPM techniques are very sensitive to changes in the charge distribution or a molecule, either by measuring the charge density (STM) or the forces (AFM) due to the charge distribution, i.e. van der Waals forces or Coulomb force. Though the switching between the states can be achieved by applying a relatively large potential between the tip of the scanning microscope and the substrate (see above), only a small potential difference is necessary to analyze the current state of the molecule and, hence, to decide whether a '0' or a '1' has been stored. Therefore, the position of the dopant is not effected by the read process.

DESCRIPTION OF THE DRAWINGS

The invention is described in detail below by way of example with reference to the drawings, which are schematic and not drawn to scale, while more particularly the dimensions of some parts are exaggerated for the sake of clarity.

EXAMPLE OF THE INVENTION

In the following, the invention is described in detail with reference to the drawings and an example.

Figure 1:
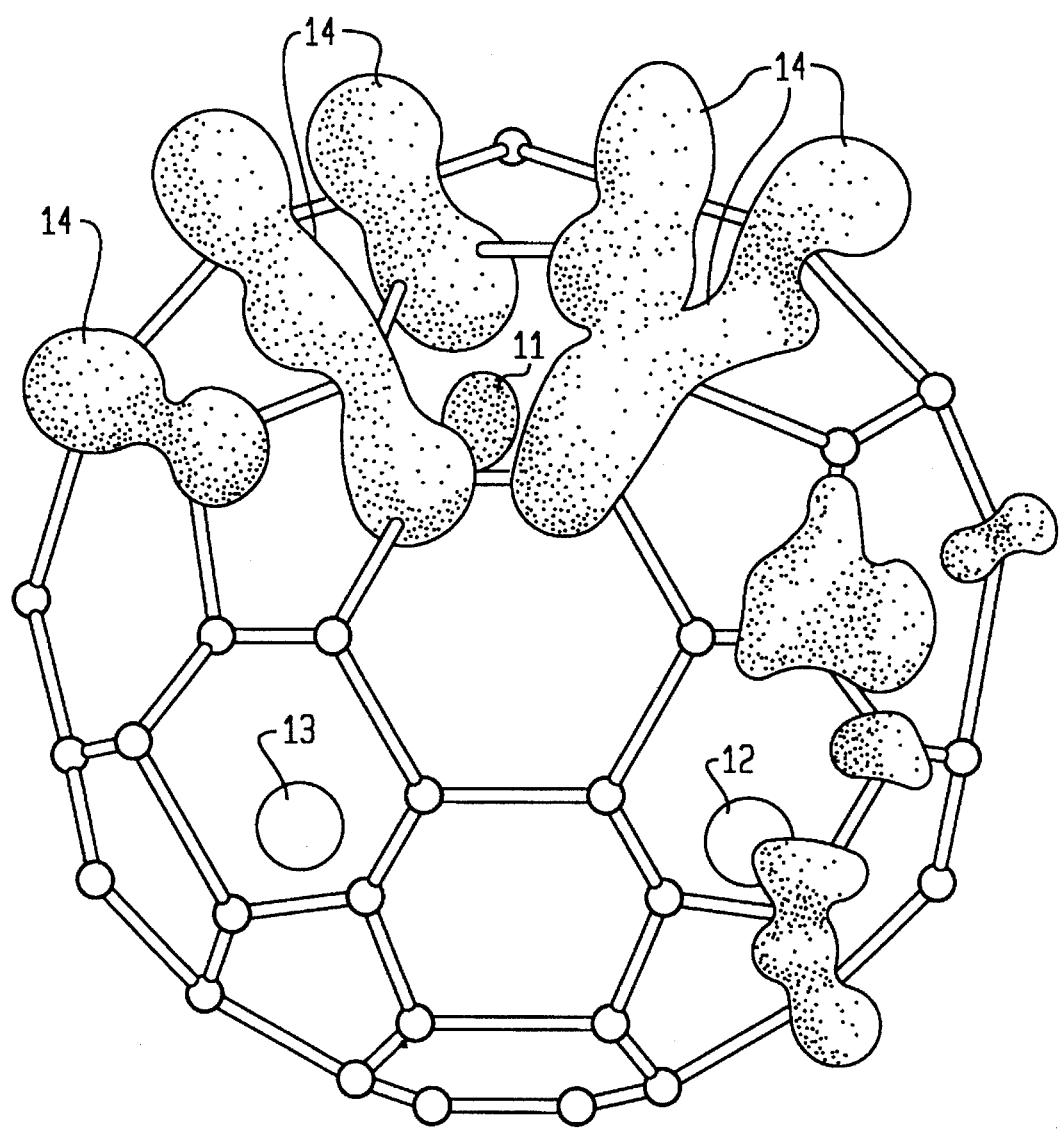
FIG. 1 shows an endohedrally doped fullerene (La@$C_{82}$) with the calculated charge distribution.
Figure 2:
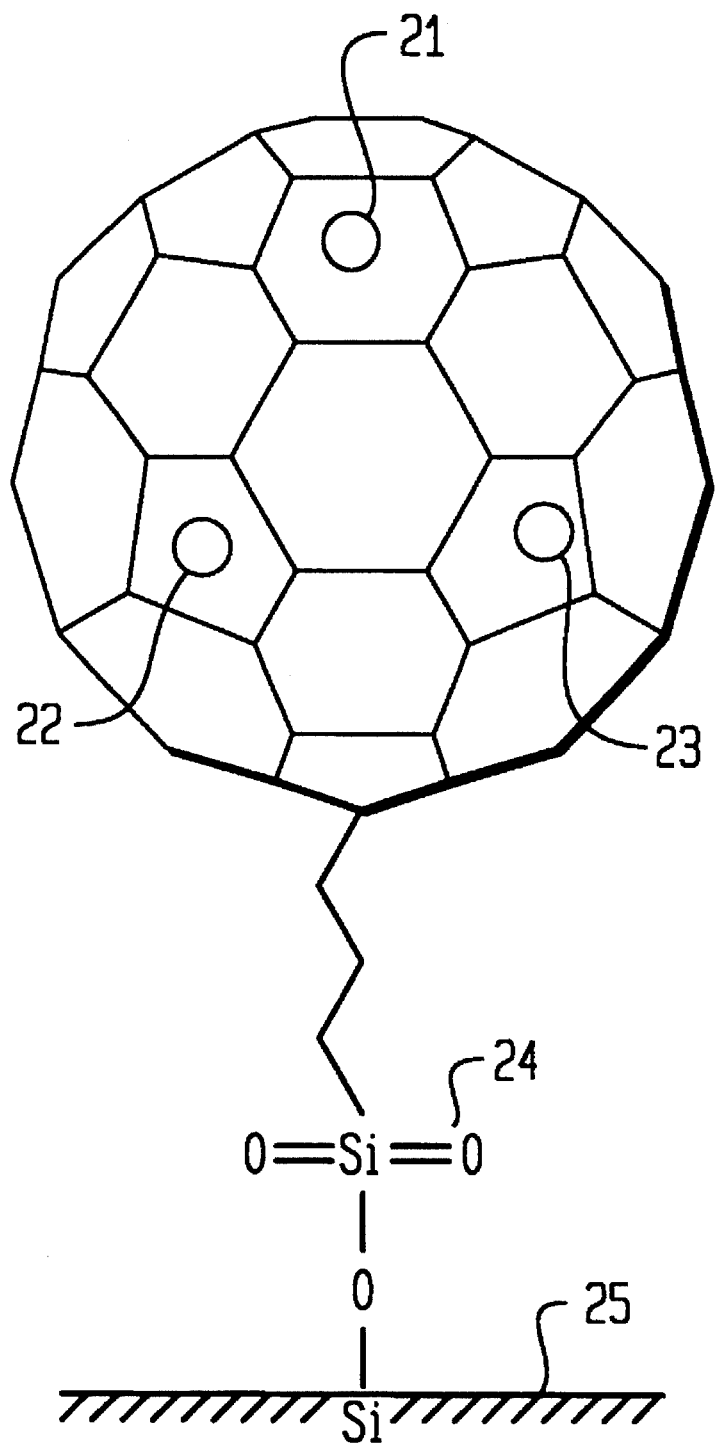
FIG. 2 shows a doped fullerene bonded to the surface of a substrate by a siloxane bridge.

In a first step, fullerenes, having a shell of 82 carbon atoms, are endohedrally doped with lanthanum. La@$C_{82}$ is prepared by toluene extraction of soot produced from arcburning of composite graphite/lanthanum oxide rods under helium at 200 Torr (275 mbar). The metal-containing $C_{82}$ is separated by chromatography. In FIG. 1, three states or potential wells within the La@$C_{82}$ are shown, in which the La finds a local equilibrium position. These three states are indicated by reference numerals 11, 12, 13. The lanthanum fills position 11. FIG. 1 also shows the distortion of the electron state 14 induced by the dopant. These distortion 14 are made visible by calculating the highest occupied molecular orbit (HOMO) of the entire molecule. Positions 1, 2, 3 become distinguishable if an axis is introduced to the molecule as is, naturally, done by the bonding procedure described next (see FIG. 2). Gd@$C_{70}$, Y@$C_{82}$, and Sc@$C_{82}$ are prepared by arcburning of composite rods containing said elements, respectively. In the following, preparation steps are the same for all doped fullerenes and are described with reference to La@$C_{82}$, only.

Figure 3:
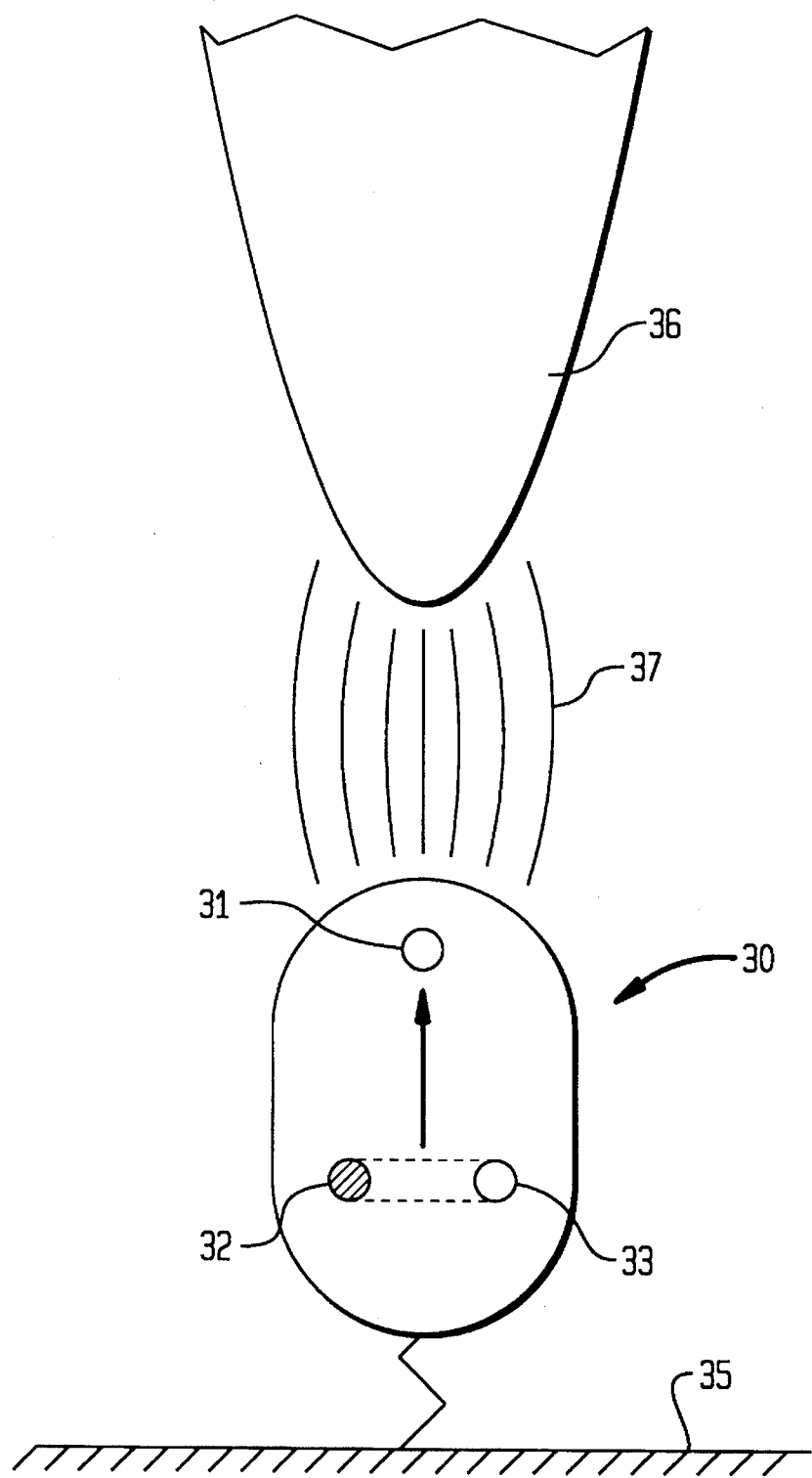
FIG. 3 shows in principle the switching (write process) of the doped fullerene from the 'down'-state to the 'up'-state.
Figure 4:
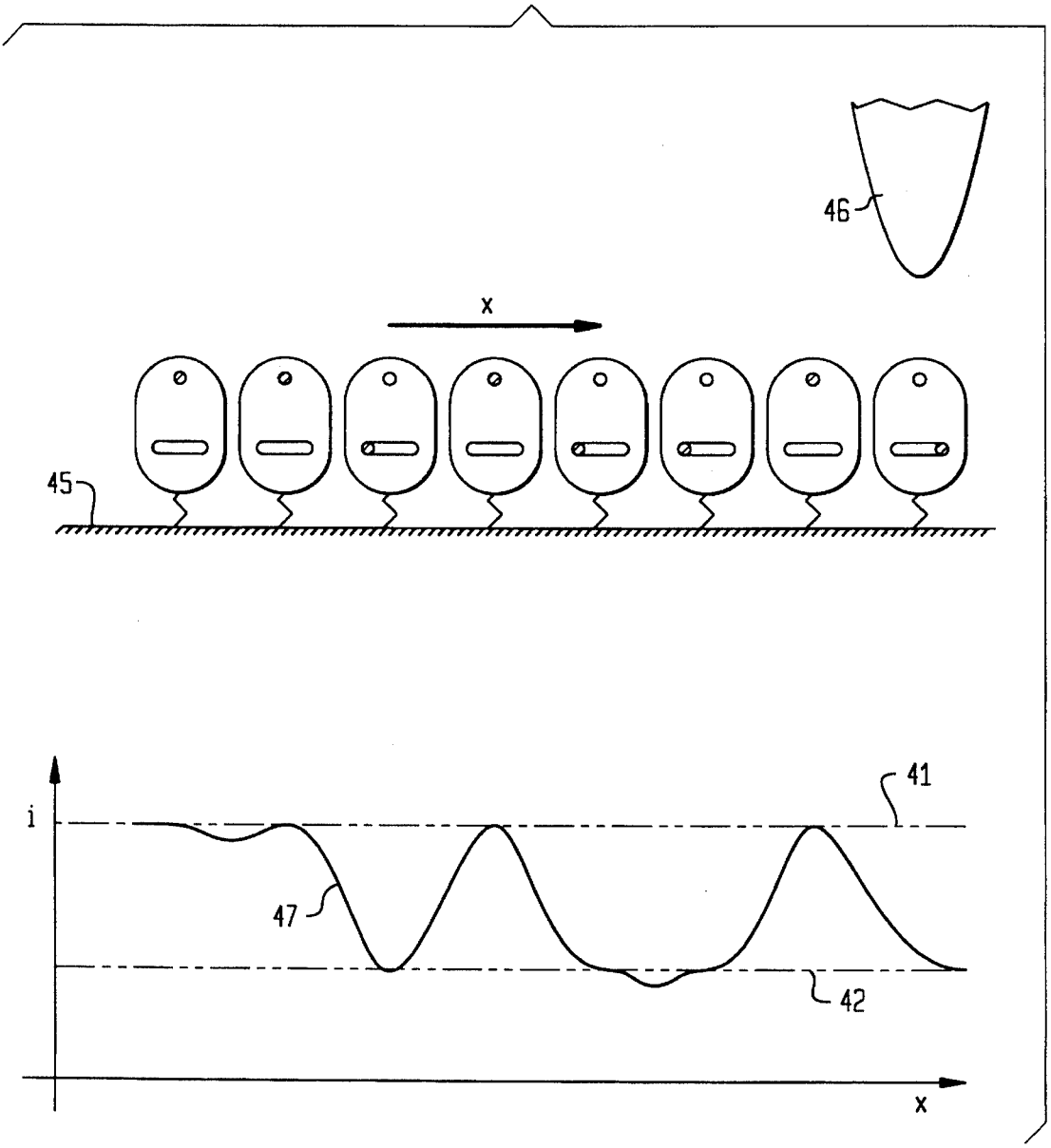
FIG. 4 shows a part of the storage device with the R/W device and the corresponding current flow in a simplified manner.

The La@$C_{82}$ fraction is oxidized by ultraviolet irradiation, using a oxygen saturated benzene solution. To the La@$C_{82}$O a silicon trichloride with an aliphatic chain ($C_3H_7SiCl_3$) is added by a standard nucleophilic reaction. As visible in FIG. 2, the silicon trichloride bonds to the surface of the silicide substrate by building a siloxane bridge 24, With the bonding, an axis is introduced to the doped fullerene, which allows to define one of the above-mentioned equilibrium positions 21 as 'up' state. This axis is the normal of the surface through the molecule. The other two equilibrium positions 22, 23 are lying in one plane perpendicular to the normal of the silicon substrate 25, i.e. parallel to the surface. Consequently, both positions 22, 23 are indistinguishable for the probing tip of the applied scanning tunnel microscope (STM) and commonly referred to as 'down' state. For storing the binary coded information, the 'up'-state 21 is defined as binary '1', whereas the 'down'-state 22, 23 corresponds to binary '0'. Of course, any other possibility is possible. The storage or write process is sketched in FIG. 3. By applying a potential difference between the tip 36 of the STM and the surface 35, an electrical field is created across the fullerene 30, which stimulates a transition of the lanthanum in the desired position. A transition from the 'down'- 32, 33 to the 'up'-position 31 is demonstrated. By reversing the direction of the electrical field, a transition in opposite direction can be stimulated. For reading the stored information, the STM is used in a constant height mode, i.e. the tip is scanned at a constant height above the surface and the current flow through it is detected. As shown by FIG. 4, the tip 46 of the STM is moved at constant height over several fullerenes fixed to the surface. The path of the tip denotes the x-direction. The measured tunneling current 47 shifts between two levels 41,42 along the x direction, which can be assigned to the fullerenes in an up and down state, respectively. Thus, the stored binary coded information byte 11010010 is read from the molecular storage device with an extrapolated storage density of approximately $10^{12}$bit/cm$^2$, which marks a major improvement over known recording media.

We claim:

1. A method for recording binary coded information comprising the steps of:

defining at least one first position of a dopant in the interior of a molecule having a cagelike structure, said molecule being attached to a substrate, said first position representing binary '1', defining at least one second position of said dopant in said molecule as representing binary '0', and moving the dopant to one of said second positions by applying an external field to the molecule.

2. A method in accordance with claim 1, wherein the external field is provided by one of an electrical field and an electromagnetic field.

3. The method in accordance with claim 1, wherein a probing tip which has a potential difference relative to the molecule is positioned in proximity to said molecule.

4. The method in accordance with claim 3, wherein a scanning probe microscope tip is used.

5. A method for reproducing binary coded information comprising the steps of:

defining at least one first position of a dopant in the interior of a molecular having a cagelike structure, said molecule being attached to a substrate, said position representing binary '1', defining at least one second position of said dopant in said cagelike molecule as representing binary '0', and determining in which of said positions the dopant is by measuring change in charge distribution of the molecule.

6. The method in accordance with claim 5, wherein a probing tip which has a potential difference relative to the molecule is positioned in proximity to said molecule.

7. The method in accordance with claim 6, wherein a scanning probe microscope tip is used.

8. A recording medium with storage elements each retaining information distinguishable from adjacent storage elements, wherein a storage element comprises at least one molecule having a cage structure attached to a substrate, each molecule enclosing at least one dopant in the interior of the cage.

9. A recording medium in accordance with claim 8, wherein the at least one molecule is one of a fullerene and a derivative thereof.

10. A recording medium in accordance with claim 8 wherein the dopant in the molecule comprises an atom chosen from a group consisting of the Group I, Group II, Group IIIa/b, rare earth elements, and transition metals.

11. A recording medium in accordance with claim 8 wherein said dopant is an atom selected from the group consisting of lanthanum, scandium and yttrium.

12. A recording medium in accordance with claim 8 wherein the molecules are attached to the substrate as a self-assembling molecular layer.

13. A recording medium in accordance with claim 9 wherein the dopant in the molecule comprises an atom chosen from a group consisting of the Group I, Group II, Group IIIa/b, rare earth elements, and transition metals.

14. A recording medium in accordance with claim 9 wherein said dopant is an atom selected from the group consisting of lanthanum, scandium and yttrium.

15. A recording medium in accordance with claim 9 wherein the molecules are attached to the substrate as a self-assembling molecular layer.

16. A recording medium in accordance with claim 10 wherein said dopant is an atom selected from the group consisting of lanthanum, scandium and yttrium.

17. A recording medium in accordance with claim 10 wherein the molecules are attached to the substrate as a self-assembling molecular layer.

18. A recording medium in accordance with claim 11 wherein the molecules are attached to the substrate as a self-assembling molecular layer.

19. An information storage apparatus comprising:

a substrate;

a plurality of endohedrally doped cage molecules attached to said substrate; and means for applying an external force to move a dopant to different locations within respective cages of said molecules.

20. The apparatus of claim 19 further comprising:

means for sensing location of said dopants in said respective cages.

21. An information storage apparatus comprising:

a substrate;

a plurality of endohedrally doped cage molecules attached to said substrate, each doped molecule having more than one position for a dopant; and means for detecting position of dopants within cages of said molecules.

22. The apparatus of claim 21 further comprising:

means for applying an external force to move a dopant to different locations within respective cages of said molecules.

* * * * *